(12) United States Patent
Lee

(10) Patent No.: US 9,859,010 B2
(45) Date of Patent: Jan. 2, 2018

(54) 3D MULTI-LAYER NON-VOLATILE MEMORY DEVICE WITH PLANAR STRING AND METHOD OF PROGRAMMING

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 21 days.

(21) Appl. No.: 14/703,196

(22) Filed: May 4, 2015

(65) Prior Publication Data

US 2016/0148696 A1    May 26, 2016

(30) Foreign Application Priority Data

Nov. 25, 2014    (KR) .................. 10-2014-0165314

(51) Int. Cl.

| G11C 16/14 | (2006.01) |
|---|---|
| G11C 16/04 | (2006.01) |
| G11C 16/10 | (2006.01) |
| G11C 16/20 | (2006.01) |

(52) U.S. Cl.
CPC .............. *G11C 16/14* (2013.01); *G11C 16/10* (2013.01); *G11C 16/20* (2013.01); *G11C 16/0483* (2013.01)

(58) Field of Classification Search
CPC ......... G11C 16/14; G11C 16/10; G11C 16/20; G11C 16/0483
USPC .................................................. 365/185.05
See application file for complete search history.

(56) References Cited

U.S. PATENT DOCUMENTS

| 5,969,990 A * | 10/1999 | Arase ................. | G11C 7/18 |
| | | | 257/E27.103 |
| 9,305,648 B2 * | 4/2016 | Nguyen ............. | G11C 16/10 |
| 2010/0002516 A1 * | 1/2010 | Sim ..................... | G11C 5/02 |
| | | | 365/185.17 |
| 2010/0172182 A1 * | 7/2010 | Seol ................... | G11C 11/5628 |
| | | | 365/185.17 |
| 2011/0199827 A1 * | 8/2011 | Puzzilli ............. | G11C 16/0483 |
| | | | 365/185.14 |
| 2012/0063194 A1 * | 3/2012 | Baek .................. | G11C 5/025 |
| | | | 365/148 |
| 2013/0148427 A1 * | 6/2013 | Lee .................... | G11C 7/18 |
| | | | 365/185.17 |

(Continued)

FOREIGN PATENT DOCUMENTS

KR    1020130047854 A    5/2013

*Primary Examiner* — Anthan Tran
*Assistant Examiner* — Mushfique Siddique
(74) *Attorney, Agent, or Firm* — William Park & Associates Ltd.

(57) ABSTRACT

A semiconductor memory device and a method of operating the same are provided. The semiconductor memory device includes a plurality of memory layers stacked on a semiconductor substrate, wherein each of the plurality of memory layers includes one or more connection control transistors, one or more drain select transistors, a plurality of memory cells, and a source select transistor electrically coupled in series between a plurality of bit lines and a common source line, and the plurality of memory layers share the plurality of bit lines, and the common source lines electrically coupled to each of the plurality of memory layers are electrically disconnected.

14 Claims, 9 Drawing Sheets

(56) References Cited

U.S. PATENT DOCUMENTS

| | | | |
|---|---|---|---|
| 2014/0036598 A1* | 2/2014 | Yang | G11C 11/5635 365/185.22 |
| 2014/0192594 A1* | 7/2014 | Lue | G11C 16/10 365/185.11 |
| 2014/0334230 A1* | 11/2014 | Kwon, II | H01L 27/11582 365/185.11 |
| 2015/0221385 A1* | 8/2015 | Ahn | G11C 16/10 365/185.2 |
| 2015/0279471 A1* | 10/2015 | Lee | G11C 16/14 365/185.11 |
| 2015/0332770 A1* | 11/2015 | Kim | G11C 16/0483 365/185.12 |
| 2015/0332783 A1* | 11/2015 | Jeong | G11C 16/10 365/185.11 |
| 2016/0035424 A1* | 2/2016 | Chang | G11C 16/10 365/185.17 |
| 2016/0055911 A1* | 2/2016 | Nguyen | G11C 16/10 365/185.17 |
| 2016/0099060 A1* | 4/2016 | Yoo | G11C 16/10 365/185.11 |
| 2016/0133329 A1* | 5/2016 | Moon | G11C 16/14 365/185.11 |
| 2016/0260485 A1* | 9/2016 | Jung | G11C 16/10 |
| 2017/0125109 A1* | 5/2017 | Park | G11C 16/0483 |
| 2017/0140829 A1* | 5/2017 | Park | G11C 16/20 |

\* cited by examiner

3D MULTI-LAYER NON-VOLATILE MEMORY DEVICE WITH PLANAR STRING AND METHOD OF PROGRAMMING

CROSS-REFERENCE TO RELATED APPLICATION

The present application claims priority to Korean patent application number 10-2014-0165314 filed on Nov. 25, 2014, in the Korean Intellectual Property Office, the entire disclosure of which is incorporated by reference herein.

BACKGROUND

1. Technical Field

The invention relates to an electronic device. More specifically, the invention relates to a semiconductor memory device and a method of operating the same.

2. Related Art

Semiconductor memory devices are memory devices implemented using a semiconductor such as silicon (Si), germanium (Ge), gallium arsenide (GaAs), indium phosphide (InP), or the like. The semiconductor memory devices are largely classified as volatile memory devices and non-volatile memory devices.

A volatile memory device is a memory device in which stored data disappears when power supply is cut off. Volatile memory devices include a static random access memory (SRAM), a dynamic RAM (DRAM), a synchronous DRAM (SDRAM), and the like. A non-volatile memory device is a memory device in which the stored data is maintained even when the power supply is cut off. Non-volatile memory devices include a read-only memory (ROM), a programmable ROM (PROM), an erasable programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), or the like. Flash memories are largely classified as a NOR type or a NAND type.

The flash memories may be classified as a two-dimensional semiconductor device in which a string is horizontally formed on a semiconductor substrate and a three-dimensional semiconductor device having a structure in which a string is vertically formed on the semiconductor substrate or a plurality of strings are stacked on the semiconductor substrate.

SUMMARY

An aspect of the invention provides a semiconductor memory device, including a plurality of memory layers stacked on a semiconductor substrate, wherein each of the plurality of memory layers includes one or more connection control transistors, one or more drain select transistors, a plurality of memory cells, and a source select transistor electrically coupled in series between a plurality of bit lines and a common source line. In addition, the plurality of memory layers share the plurality of bit lines. Further, the common source lines electrically coupled to each of the plurality of memory layers are electrically disconnected.

An aspect of the invention provides a method of operating a semiconductor memory device including a plurality of memory layers stacked on a semiconductor substrate, wherein each of the plurality of memory layers includes first and second connection control transistors, a drain select transistor, a plurality of memory cells, and a source select transistor, which are electrically coupled in series between a plurality of bit lines and a common source line. The method includes programming the first and second connection control transistors of the plurality of memory layers. The method also includes erasing the second connection control transistor adjacent to the drain select transistor of a selected memory layer. Further, the method also includes coding-programming the drain select transistor of the selected memory layer. In addition, the method includes programming the second connection control transistor of the selected memory layer. Further, the method includes erasing the first and second connection control transistors.

An aspect of the invention provides a method of operating a semiconductor memory device including a plurality of memory layers stacked on a semiconductor substrate, wherein each of the plurality of memory layers includes first and second connection control transistors, a drain select transistor, a plurality of memory cells, and a source select transistor electrically coupled in series between a plurality of bit lines and a common source line. The method includes programming the second connection control transistor adjacent to the drain select transistor of the plurality of memory layers. The method also includes erasing the second connection control transistor of a selected memory layer. Further, the method includes coding-programming the drain select transistor of the selected memory layer. In addition, the method includes programming the second connection control transistor of the selected memory layer. The method also includes erasing the first and second connection control transistors of the plurality of memory layers.

An aspect of the invention provides a method of operating a semiconductor memory device including a plurality of memory layers, wherein the plurality of memory layers are stacked and share a plurality of bit lines, and common source lines of the plurality of memory layers are separated. The method includes coding-programming a first drain select transistor of a selected memory layer. The method also includes coding-programming a second drain select transistor of a selected memory layer.

An aspect of the invention provides a method of operating a semiconductor memory device including a plurality of memory layers, wherein the plurality of memory layers are stacked and share a plurality of bit lines, and common source lines of the plurality of memory layers are separated. The method includes programming a drain select transistor or a memory cell adjacent to a selected drain select transistor among two or more drain select transistors included in the plurality of memory layers. The method also includes erasing an adjacent drain select transistor or adjacent the memory cell of a selected memory layer. The method may also include coding-programming the selected drain select transistor of the selected memory layer. The method also includes programming the adjacent drain select transistor or the memory cell of the selected memory layer. In addition, the method includes erasing the adjacent drain select transistor or the memory cell of the plurality of memory layers.

An aspect of the invention provides a method of operating a semiconductor memory device including a plurality of memory layers, wherein the plurality of memory layers are stacked and share a plurality of bit lines, and common source lines of the plurality of memory layers are separated. The method includes programming a drain select transistor or a memory cell adjacent to a selected drain select transistor among two or more drain select transistors included in a selected memory layer. The method also includes coding-programming the selected drain select transistor of the selected memory layer. Further, the method includes erasing an adjacent drain select transistor or the adjacent memory cell of the selected memory layer.

DETAILED DESCRIPTION

Various embodiments of the invention will be described more fully hereinafter with reference to the accompanying figures. The invention may, however, be embodied in different forms and should not be construed as limited to the embodiments set forth. Various embodiments of the invention are described below in sufficient detail with reference to accompanying figures to enable those of ordinary skill in the art to embody and practice the invention. The invention is directed to a semiconductor memory device capable of performing a multi-level coding on a drain select transistor arranged in each memory layer in a three-dimensional semiconductor memory device having a structure in which a plurality of memory layers are stacked on a semiconductor substrate, and a method of operating the same.

Throughout the specification, it will be understood that when an element is referred to as being "connected" or "coupled" to another element, it can be directly connected or electrically coupled to the other element or intervening elements may be present. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1:
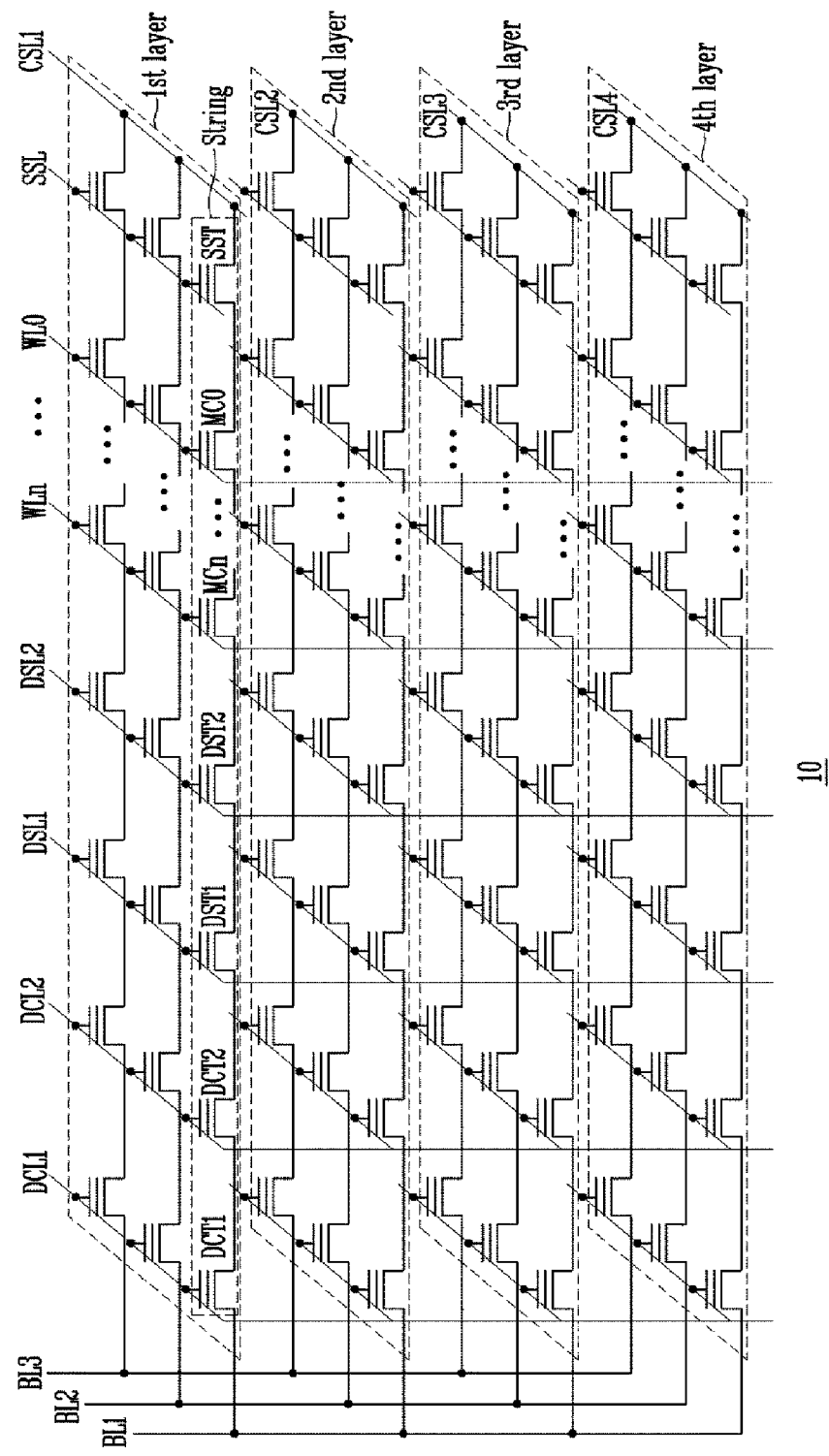
FIG. 1 is a circuit diagram illustrating cell strings of a semiconductor memory device according to an embodiment of the invention.

Referring to FIG. 1, a circuit diagram illustrating cell strings of a semiconductor memory device according to an embodiment of the invention is shown.

In FIG. 1, a semiconductor memory device 10 may be formed to have a structure in which a plurality of memory layers (first to fourth layers) are stacked on a semiconductor substrate. In an embodiment of the invention, the semiconductor memory device 10 in which four memory layers are stacked is illustrated, but is not limited thereto and may be formed to have a structure in which five or more memory layers are stacked. Each of the plurality memory layers (the first to fourth layers) may be defined as one memory block.

One memory layer (for example, the first layer) may include a plurality of cell strings arranged in parallel, and each of the plurality of cell strings may be electrically coupled to each of a plurality of bit lines BL1 to BL3. In an embodiment of the invention, the semiconductor memory device 10 in which three cell strings are arranged in one memory layer is illustrated, but is not limited thereto. Further, the semiconductor memory device 10 may be formed to have a structure in which four or more cell strings and four or more bit lines are arranged. Further, the plurality of cell strings arranged in one memory layer may be commonly electrically coupled to a common source line (for example, CSL1). FIG. 1 also illustrates common source lines CSL2, CSL3 and CSL4 and 1st to 4th layers. The common source lines CSL1 to CSL4 connected to each of the plurality of memory layers are electrically disconnected.

One cell string may include first and second connection control transistors DCT1 and DCT2, first and second drain select transistors DST1 and DST2, a plurality of memory cells MC0 to MCn, and a source select transistor SST, which are electrically coupled between a bit line (for example, BL1) and the common source line (for example, CSL1). Gates of the first and second connection control transistors DCT1 and DCT2 may be electrically coupled to first and second connection control lines DCL1 and DCL2, respectively. Further, gates of the first and second drain select transistors DST1 and DST2 may be electrically coupled to first and second drain select lines DSL1 and DSL2, respectively. Gates of the plurality of memory cells MC0 to MCn may be electrically coupled to a plurality of word lines WL0 to WLn, respectively, and a gate of the source select transistor SST may be electrically coupled to a source select line SSL.

Further, the plurality of cell strings formed in the same layer may share the first and second connection control lines DCL1 and DCL2, the first and second drain select lines DSL1 and DSL2, the plurality of word lines WL0 to WLn, and the source select line SSL.

Moreover, the plurality of memory layers (the first to fourth layers) may share the plurality of bit lines BL1 to BL3.

In the semiconductor memory device 10 having the structure described above, each of the plurality of memory layers (the first to fourth layers) should be electrically disconnected to perform program and read operations by selecting one memory block since the plurality of memory layers (the first to fourth layers) share the plurality of bit lines (BL1 to BL3).

In an embodiment of the invention, an example in which two connection control transistors and two drain select transistors are included in one string is described, but is not limited thereto and may be configured so that one connection control transistor and one drain select transistor are included in one string.

Figure 2:
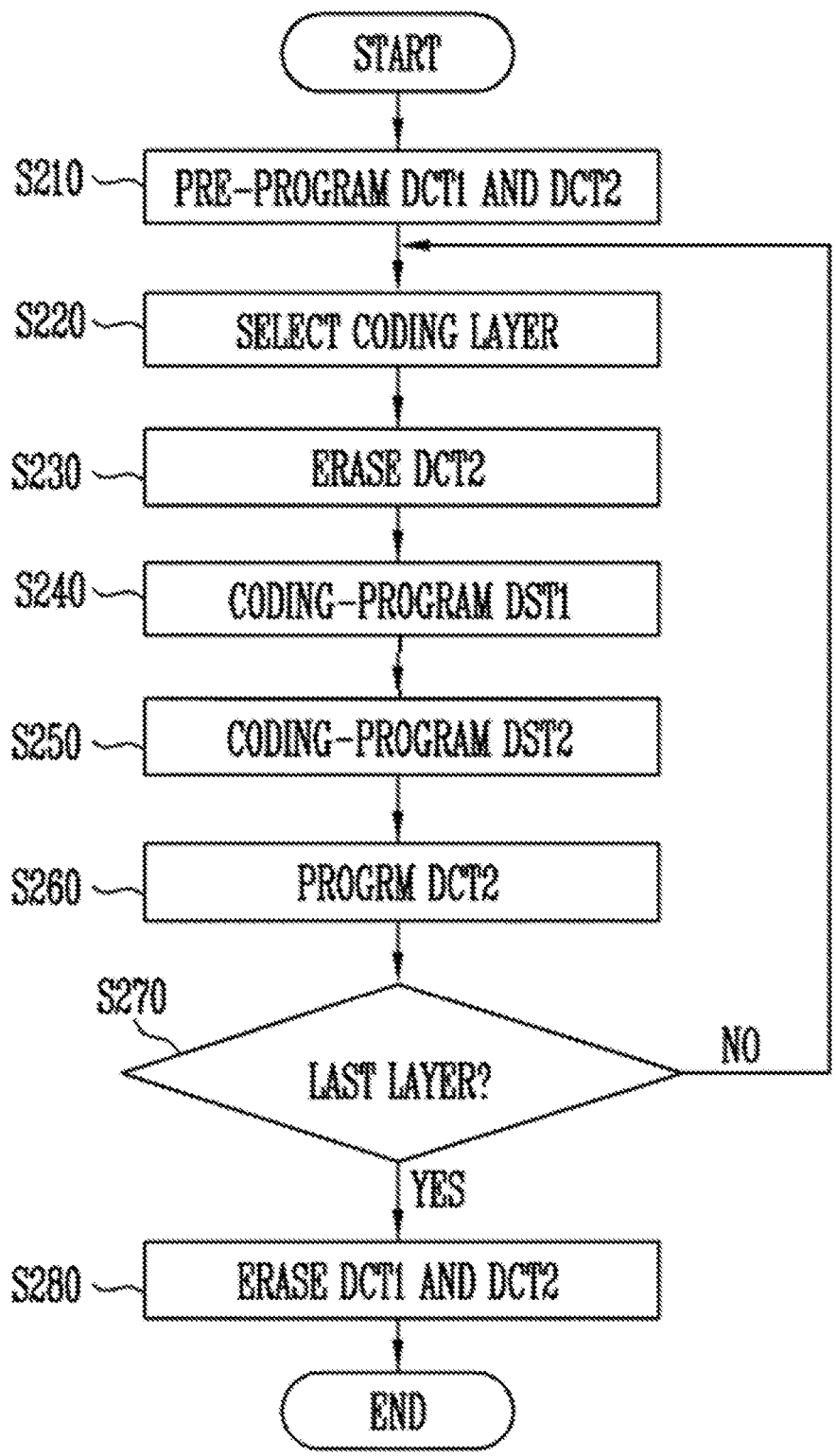
FIG. 2 is a flowchart for describing a method of operating the semiconductor memory device shown in FIG. 1.

Referring to FIG. 2, a flowchart for describing a method of operating the semiconductor memory device shown in FIG. 1 is illustrated.

In FIGS. 1 and 2, a method of operating the semiconductor memory device according to an embodiment of the invention will be described.

Bias voltages applied in the method of operating the semiconductor memory device according to an embodiment of the invention are shown in the following Table 1.

TABLE 1

|  | BL | DCL1 | DCL2 | DSL1 | DSL2 | WLs | SSL | Sel CSL | Unsel CSL |
|---|---|---|---|---|---|---|---|---|---|
| DCT1 & DCT2 program (Pgm) | 0 V | ISPP | ISPP | Vpass | Vpass | 0 V | 0 V | 0 V | 0 V |
| DCT2 Erase Method 1 | F | Vt + 1 V | 0 V | Vpass | Vpass | Vpass | Ver-a | Verase | 0 V |
| DCT2 Erase Method 2 | F | 0 V | 0 V | Vpass | Vpass | Vpass | Vdc | Vdc | 0 V |
| DST1 coding Pgm | 0 V (during Pgm) 4.5 V (Pgm inhibit) | Turn-on | 0 V | ISPP | Vpass | Vpass | 0 V | Vdc | 0 V |
| DST2 coding Pgm | 0 V (during Pgm) 4.5 V (Pgm inhibit) | Turn-on | 0 V | Vpass | ISPP | Vpass | 0 V | Vdc | 0 V |
| DCT2 Pgm | 0 V | Turn-on | ISPP | Vpass | Vpass | 0 V | 0 V | 0 V | 0 V |

1) Pre-Program Operation on DCT1 and DCT2 (S210)

First, the first and second connection control transistors DCT1 and DCT2 of every memory layer (the first to fourth layers) may be pre-programmed. At this time, a program-allowing voltage (for example, 0V) may be applied to the bit lines BL1 and BL3. Further, a pass voltage Vpass may be applied to the first and second drain select lines DSL1 and DSL2. After this, an incremental step pulse program (ISPP) pulse that is sequentially increased by a step pulse may be applied to the first and second connection control lines DCL1 and DCL2. In addition, the first and second connection control transistors DCT1 and DCT2 may be pre-programmed. At this time, the pre-program operations of the first and second connection control transistors DCT1 and DCT2 may be sequentially performed on the first and second connection control transistors DCT1 and DCT2, or be simultaneously performed.

2) Operation of Selecting a Memory Layer in which a Coding Program Operation is Performed (S220)

A memory layer in which a coding program operation is performed among the plurality of memory layers (the first to fourth layers) may be selected. More specifically, a memory layer in which the coding program operation is performed may be selected so that the first and second drain select transistors DST1 and DST2 have a multi-level. At this time, the first to fourth memory layers may be sequentially selected.

3) Erase Operation on DCT2 (S230)

An erase operation on the second connection control transistor DCT2 of the selected memory layer (for example, the first layer) may be performed. At this time, the erase operation may be performed in two methods.

A first method may be a method of applying an erase voltage Verase through the common source line CSL1. After controlling the bit lines BL1 to BL3 to be in a floating state F, the first connection control transistor DCT1 may be turned on by applying a turn-on voltage Vt+1V to the first connection control line DCL1. After this, the pass voltage Vpass may be applied to the first and second drain select lines DSL1 and DSL2 and the plurality of word lines WL0 to WLn, the erase voltage Verase may be applied to the common source line CSL1 of the memory layer (for example, the first layer) selected as the coding program memory layer, and only the second connection control transistor DCT2 which is pre-programmed may be selectively erased. At this time, it may be desirable to apply a set voltage Ver-a which is lower than the erase voltage Verase to the source select line SSL.

A second method may be a method of erasing by boosting a channel to a high potential. After controlling the bit lines BL1 to BL3 to be in the floating state F, the first and second connection control transistors DCT1 and DCT2 are turned off by applying a voltage of 0V to the first and second connection control lines DCL1 and DCL2. A power supply voltage Vdc may be applied to the common source line CSL1 and the source select line SSL of the memory layer (for example, the first layer) selected as the coding program memory layer. After this, the pass voltage Vpass may be applied to the first and second drain select lines DSL1 and DSL2 and the plurality of word lines WLs: WL0 to WLn. Further, the channel of the cell string may be boosted to a high potential. Accordingly, the second connection control transistor DCT2 adjacent to the boosted channel may be erased by a potential difference with the boosted channel.

4) Coding Program Operation on DST1 (S240)

The first drain select transistor DST1 of the selected memory layer (for example, the first layer) may be coding-programmed. The program-allowing voltage (0V) may be applied to a selected bit line among the plurality of bit lines. Further, a program-inhibiting voltage (4.5V) may be applied to a non-selected bit line. At this time, the pre-programmed first connection control transistor DCT1 may be turned on when a potential of the electrically coupled bit line is the program-allowing voltage (0V), and may be turned off when the potential of the electrically coupled bit line is the program-inhibiting voltage (4.5V). After this, the ISPP pulse which is sequentially increased by the step pulse may be applied to the first drain select line DSL1. Further, the pass voltage Vpass may be applied to the second drain select line DSL2 and the plurality of word lines WLs: WL0 to WLn. In addition, the first drain select transistor DST1 may be coding-programmed.

5) Coding Program Operation on DST2 (S250)

When the coding program operation on the first drain select transistor DST1 is completed, the coding program of the second drain select transistor DST2 may be performed. The coding program operation on the second drain select transistor DST2 may be similar to that of the first drain select transistor DST1. Further, the ISPP pulse which is sequentially increased by the step pulse may be applied to the second drain select line DSL2. In addition, the pass voltage Vpass may be applied to the first drain select line DSL1 and the plurality of word lines WLs: WL0 to WLn. Further, the second drain select transistor DST2 may be coding-programmed.

6) Program Operation on DCT2 (S260)

The second connection control transistor DCT2 which is in an erase state may be programmed. The program operation on the second connection control transistor DCT2 may be the same as the pre-program operation on the first and second connection control transistors DCT1 and DCT2 (S210) described above, but only the second connection control transistor DCT2 of the selected memory layer may be programmed.

7) Operation of Confirming Whether the Memory Layer is a Last Memory Layer (S270)

It may be confirmed whether the memory layer in which a current coding program operation is performed is a last memory layer (the fourth layer). When it is determined that the memory layer is not the last memory layer (the fourth layer), a next memory layer of the currently selected memory layer may be selected. Further, it may be returned to the operation of selecting the memory layer in which the coding program operation is performed (S220).

8) Erase Operation on DCT1 and DCT2 (S280)

When it is determined that the currently selected memory layer described above is the last memory layer (the fourth layer) in the operation of confirming whether the memory layer is the last memory layer (S270) and the first and second connection control transistors DCT1 and DCT2 are erased, a side effect of the cell string due to threshold voltages of the first and second connection control transistors DCT1 and DCT2 may be prevented as a result.

A method of erasing the first and second connection control transistors DCT1 and DCT2 may be performed by the method of applying the erase voltage Verase through the common source line CSL1 described in the erase operation on the DCT2 (S230) described above, or the method of erasing by boosting the channel to the high potential.

In the semiconductor memory device described above, coding threshold voltage distribution of the drain select transistor arranged in each memory layer may be improved by additionally arranging the connection control transistor to control the connection of each memory layer and the bit line between the bit line and the drain select transistor of each memory layer. Accordingly, efficiency of main memory cells may be increased since a multi-level coding of the drain select transistor can be performed.

Figure 3:
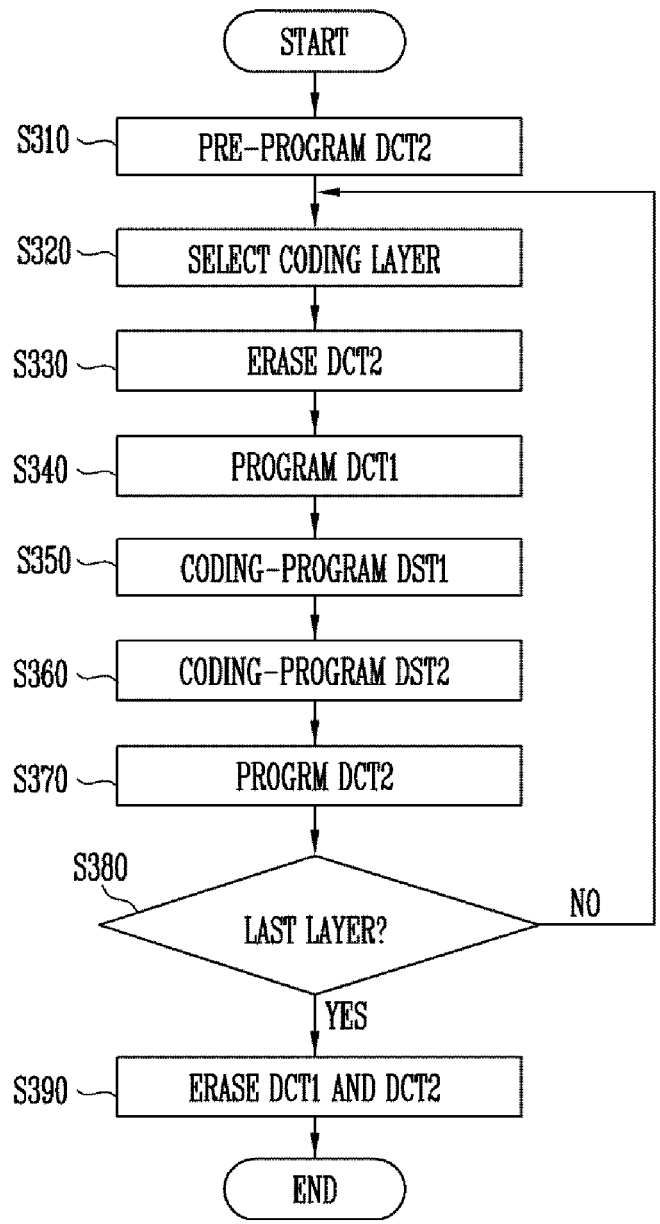
FIG. 3 is a flowchart for describing a method of operating the semiconductor memory device shown in FIG. 1.

Referring to FIG. 3, a flowchart for describing a method of operating the semiconductor memory device shown in FIG. 1 is illustrated.

In FIGS. 1 and 3, a method of operating the semiconductor memory device according to an embodiment of the invention will be described below.

An embodiment of the invention may be applied when an abnormal phenomenon in which the threshold voltage of the first connection control transistor DCT1 is decreased is generated in the erase operation on the second connection control transistor DCT2 described with reference to FIG. 2.

Bias voltages applied in the method of operating the semiconductor memory device according to an embodiment of the invention may be shown in the following Table 2.

TABLE 2

|  |  | BL | DCL1 | DCL2 | DSL1 | DSL2 | WLs | SSL | Sel CSL | Unsel CSL |
|---|---|---|---|---|---|---|---|---|---|---|
| DCL1 & DCL2 Program (Pgm) |  | 0 V | ISPP | ISPP | Vpass | Vpass | 0 V | 0 V | 0 V | 0 V |
| DCL2 Erase | Method 1 | F | Vt + 1 V | 0 V | Vpass | Vpass | Vpass | Ver-a | Verase | 0 V |
|  | Method 2 | F | 0 V | 0 V | Vpass | Vpass | Vpass | Vdc | Vdc | 0 V |
| DCL1 Pgm | Method 1 | 4 V | Vpgm2 | Vpass | Vpass | Vpass | Vpass | 0 V | 0 V | 4 V |
|  | Method 2 | 4 V | Vpgm2 | GIDL or DAHE or DIBL | Vpass | Vpass | Vpass | 0 V | 0 V | 4 V |
| DSL1 coding Pgm |  | 0 V (during Pgm) | Turn-on | 0 V | ISPP | Vpass | Vpass | Vdc | Vdc | 0 V |
| DSL2 coding Pgm |  | 4.5 V (Pgm inhibit) | Turn-on | 0 V | Vpass | ISPP | Vpass | Vdc | Vdc | 0 V |
| DCL2 Pgm |  | 0 V | Turn-on | ISPP | Vpass | Vpass | 0 V | 0 V | 0 V | 0 V |

1) Pre-Program Operation on DCT2 (S310)

First, the second connection control transistor DCT2 of every memory layer (the first to fourth layers) may be pre-programmed. At this time, a program-allowing voltage (for example, 0V) may be applied to the bit lines BL1 to BL3. Further, a voltage of 0V may be applied to the first connection control line DCL1. Moreover, a pass voltage Vpass may be applied to the first and second drain select lines DSL1 and DSL2. In addition, a voltage of 0V may be applied to the plurality of word lines WLs: WL0 to WLn, the source select line SSL, and the common source lines CSL1 to CSL4. After this, an ISPP pulse which is sequentially increased by a step pulse may be applied to the second connection control line DCL2, and the second connection control transistor DCT2 may be pre-programmed.

2) Operation of Selecting a Memory Layer in which a Coding Program Operation is Performed (S320)

A memory layer in which a coding program operation is performed so that the first and second drain select transistors DST1 and DST2 among the plurality of memory layers (the first to fourth layers) have a multi-level may be selected. At this time, the first to fourth memory layers (the first to fourth layers) may be sequentially selected.

3) Erase Operation on DCT2 (S330)

An erase operation may be performed on the second connection control transistor DCT2 of a selected memory layer (for example, the first layer). At this time, the erase operation may be performed in two methods.

A first method may be a method of applying an erase voltage Verase through the common source line CSL1. After controlling the bit lines BL1 to BL3 to be in a floating state F, the first connection control transistor DCT1 may be turned on by applying a turn-on voltage Vt+1V to the first connection control line DCL1. After this, the pass voltage Vpass may be applied to the first and second drain select lines DSL1 and DSL2 and the plurality of word lines WLs: WL0 to WLn, the erase voltage Verase may be applied to the common source line CSL1 of the memory layer (for example, the first layer) selected as the coding program memory layer. Further, only the pre-programmed second connection control transistor DCT2 may be selectively erased. At this time, it may be desirable to apply a set voltage Ver-a which is lower than the erase voltage Verase to the source select line SSL.

A second method may be a method of erasing by boosting a channel to a high potential. After controlling the bit lines BL1 to BL3 to be in the floating state F, the first and second connection control transistors DCT1 and DCT2 may be turned off by applying a voltage of 0V to the first and second connection control lines DCL1 and DCL2. A power supply voltage Vdc may be applied to the common source line CSL1 and the source select line SSL of the memory layer (for example, the first layer) selected as the coding program memory layer. After this, the pass voltage Vpass may be applied to the first and second drain select lines DSL1 and DSL2 and the plurality of word lines WLs: WL0 to WLn. In addition, the channel of the cell string may be boosted to the high potential. Accordingly, the second connection control transistor DCT2 adjacent to the boosted channel may be erased by a potential difference with the boosted channel.

4) Program Operation on DCT1 (S340)

A program operation on the first connection control transistor DCT1 may be performed in two methods.

A first method may be a hot carrier injection (HCI) method. The pass voltage Vpass may be applied to the second connection control line DCL2, the first and second drain select lines DSL1 and DSL2, and the plurality of word lines WLs: WL0 to WLn. Further, a high voltage (4V) may be applied to the bit line. Accordingly, a hot carrier may be generated in a channel adjacent to the first connection control transistor DCT1. In addition, at this time, the first connection control transistor DCT1 may be programmed by tunneling the hot carrier to a charge storage layer of the first connection control transistor DCT1 when a program voltage Vpgm2 having a lower potential level than a normal program voltage is applied to the first connection control line DCL1.

A second method may be a method using a gate induced drain leakage (GIDL), a drain avalanche hot carrier (DAHC), or a drain induced barrier lowering (DIBL). The pass voltage Vpass may be applied to the first and second drain select lines DSL1 and DSL2. In addition, the plurality of word lines WLs: WL0 to WLn, and a high voltage (4V) may be applied to the bit line. At this time, the second connection control transistor DCT2 may be turned on so that the GIDL, the DAHC, or the DIBL is generated in the second connection control transistor DCT2, but a voltage applied to the second connection control line DCL2 may be adjusted so that the second connection control transistor DCT2 is shallowly turned on. At this time, when the program voltage Vpgm2 having the lower potential level than the normal program voltage is applied to the first connection control line DCL1, a carrier generated by the GIDL, DAHC, or DIBL may be tunneled to the charge storage layer of the first connection control transistor DCT1. Further, the first connection control transistor DCT1 may be programmed.

5) Coding Program Operation on DST1 (S350)

First, the first drain select transistor DST1 of the selected memory layer (for example, the first layer) may be coding-programmed. The program-allowing voltage (0V) may be applied to a selected bit line among the plurality of bit lines. Further, the program-inhibiting voltage (4.5V) may be applied to a non-selected bit line. At this time, the pre-programmed first connection control transistor DST1 may be turned on when a potential of the connected bit line is the program-allowing voltage (0V), and may be turned off when the potential of the connected bit line is the program-inhibiting voltage (4.5V). After this, the ISPP pulse which is sequentially increased by the step pulse may be applied to the first drain select line DSL1, the pass voltage Vpass may be applied to the second drain select line DSL2 and the plurality of word lines WLs: WL0 to WLn. In addition, the first drain select transistor DST1 may be coding-programmed.

6) Coding Program Operation on DST2 (S360)

When the coding program operation on the first drain select transistor DST1 is completed, the coding program operation on the second drain select transistor DST2 may be performed. The coding program operation on the second drain select transistor DST2 may be similar to that of the first drain select transistor DST1. The ISPP pulse which is sequentially increased by the step pulse may be applied to the second drain select line DSL2. The pass voltage Vpass may be applied to the first drain select line DSL1 and the plurality of word lines WLs: WL0 to WLn. In addition, the second drain select transistor DST2 may be coding-programmed.

7) Program Operation on DCT2 (S370)

The second connection control transistor DCT2 may be programmed. At this time, the program-allowing voltage (for example, 0V) may be applied to the bit lines (BL1 to BL3), and a voltage of 0V may be applied to the first connection control line DCL1. Further, the pass voltage Vpass may be applied to the first and second drain select lines DSL1 and DSL2. In addition, the voltage of 0V may be applied to the plurality of word lines WLs: WL0 to WLn, the source select line SSL, and the common source lines CSL1 to CSL4. After this, the ISPP pulse which is sequentially increased by the step pulse may be applied to the second connection control line DCL2. Further, the second connection control transistor DCT2 may be programmed.

8) Operation of Confirming Whether a Memory Layer is a Last Memory Layer (S380)

It may be confirmed whether a memory layer in which a current coding program operation is performed is a last memory layer (the fourth layer). Accordingly, when it is determined that the memory layer is not the last memory layer (the fourth layer), it may be returned to the operation of selecting the memory layer in which the coding program operation is performed (S320) by selecting a next memory layer of the currently selected memory layer.

9) Erase Operation on DCT1 and DCT2 (S390)

In the operation of confirming whether the memory layer is the last memory layer (S380) described above, when it is determined that the currently selected memory layer is the last memory layer (the fourth layer), an erase operation on the first and second connection control transistors DCT1 and DCT2 may be performed. Accordingly, a side effect of the cell string due to threshold voltages of the first and second connection control transistors DCT1 and DCT2 may be prevented as a result.

A method of erasing the first and second connection control transistors DCT1 and DCT2 may be performed by the method of applying the erase voltage Verase through the common source line CSL1 described in the erase operation on DCT2 (S330) described above, or, in the alternative, by the method of erasing by boosting the channel to the high potential.

In the semiconductor memory device described above, coding threshold voltage distribution of the drain select transistor arranged in each memory layer may be improved by additionally arranging the connection control transistor to control the connection of each memory layer and the bit line between the bit line and the drain select transistor of each memory layer. Accordingly, efficiency of main memory cells may be increased since a multi-level coding of the drain select transistor can be performed as a result.

Figure 4:
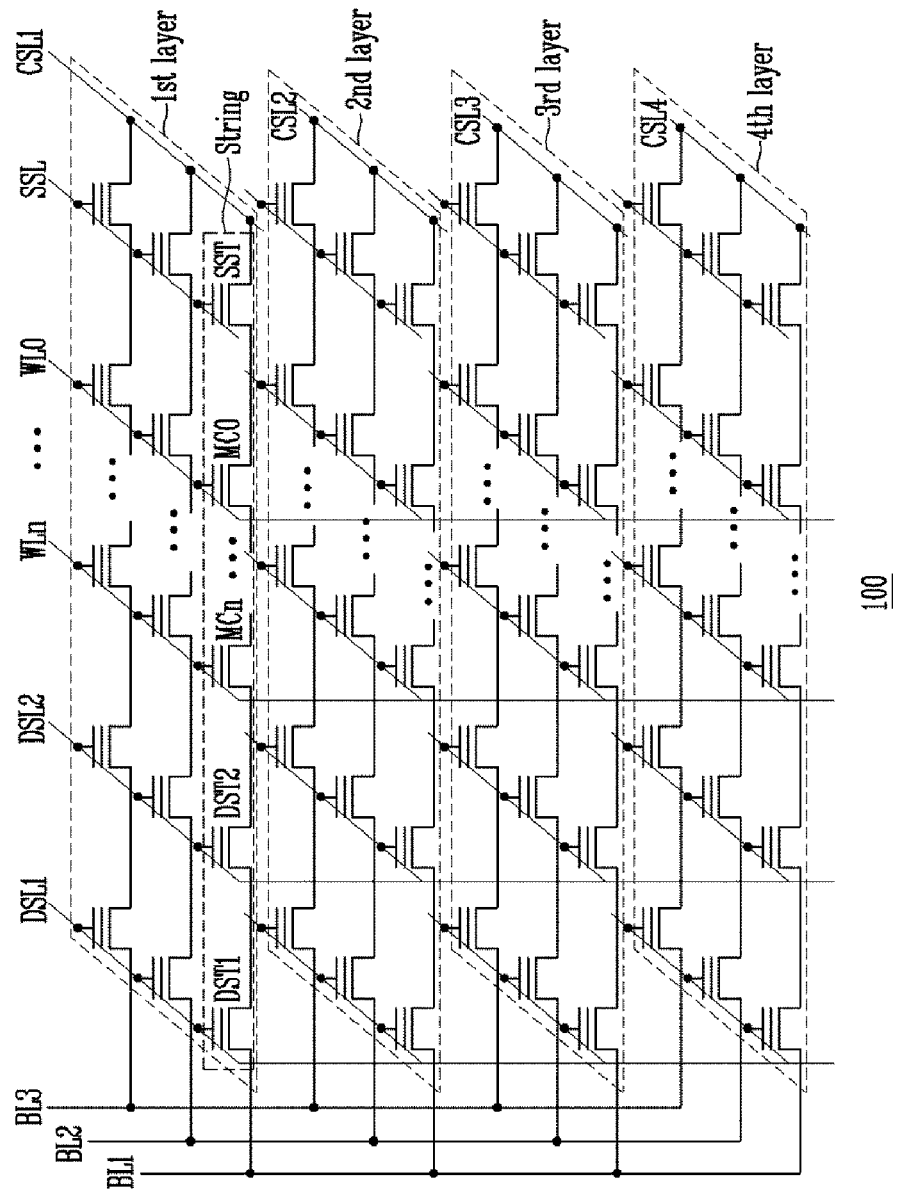
FIG. 4 is a circuit diagram of cell strings of a semiconductor memory device according to an embodiment of the invention.

Referring to FIG. 4, a circuit diagram illustrating cell strings of a semiconductor memory device according to an embodiment of the invention is shown.

In FIG. 4, a semiconductor memory device 100 may be formed to have a structure in which the plurality of memory layers (the first to fourth layers) are stacked. In an embodiment of the invention, an example of the semiconductor memory device having a structure in which four memory layers are stacked is illustrated, but is not limited thereto. In addition, the semiconductor memory device may be formed to have a structure in which five or more memory layers are stacked. Each of the plurality of memory layers (the first to fourth layers) may be defined as one memory block.

One memory layer (for example, the first layer) may include a plurality of cell strings arranged in parallel. In addition, each of the plurality of cell strings may be electrically coupled to the plurality of bit lines BL1 to BL3. In an embodiment of the invention, an example of the semiconductor memory device in which three cell strings are arranged in one memory layer is illustrated, but is not limited thereto. In addition, the semiconductor memory device may be formed to have a structure in which four or more cell strings and four or more bit lines are arranged in one memory layer. Further, the plurality of cell strings which are arranged in one memory layer may be commonly electrically coupled to the common source line (for example, CSL1).

One cell string may include the first and second drain select transistors DST1 and DST2, the plurality of memory cells MC0 to MCn, and the source select transistor SST, which are electrically coupled between the bit line (for example, BL1) and the common source line (for example, CSL1). Gates of the first and second drain select transistors DST1 and DST2 may be electrically coupled to the first and second drain select lines DSL1 and DSL2, respectively. Gates of the plurality of memory cells MC0 to MCn may be electrically coupled to the plurality of word lines WL0 to WLn, respectively, and a gate of the source select transistor SST may be electrically coupled to the source select line SSL.

Further, the plurality of cell strings which are formed in the same layer may share the first and second drain select lines DSL1 and DSL2, the plurality of word lines WL0 to WLn, and the source select line SSL.

Moreover, the plurality of memory layers (the first to fourth layers) may share the plurality of bit lines BL1 to BL3.

Since the plurality of memory layers (the first to fourth layers) of the semiconductor memory device 100 having the structure described above share the plurality of bit lines BL1 to BL3, each of the plurality of memory layers (the first to fourth layers) should be electrically disconnected so as to perform the program and read operations by selecting one memory block.

In an embodiment of the invention, an example of the semiconductor memory device having a configuration in which one cell string includes two drain select transistors is illustrated, but is not limited thereto. In addition, the semiconductor memory device may have a configuration in which one cell string includes two or more drain select transistors.

Figure 5:
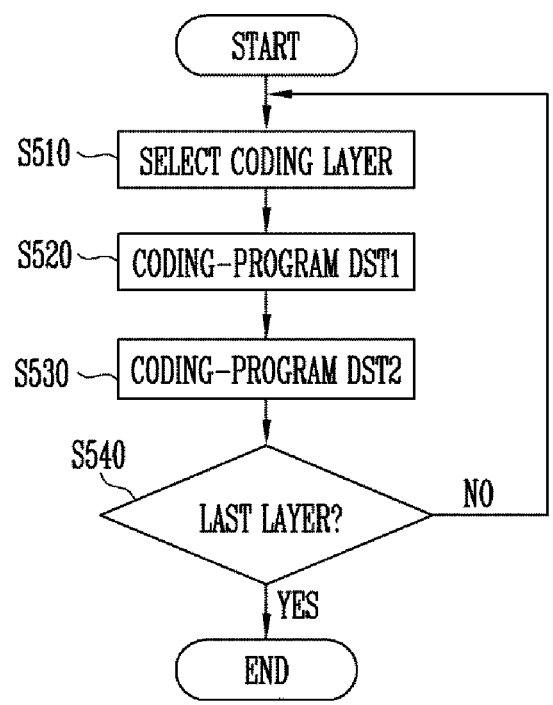
FIG. 5 is a flowchart for describing a method of operating the semiconductor memory device shown in FIG. 4.

Referring to FIG. 5, a flowchart for describing a method of operating the semiconductor memory device shown in FIG. 4 is illustrated.

In FIGS. 4 and 5, a method of operating the semiconductor memory device according to an embodiment of the invention will be described.

Bias voltages applied in the method of operating the semiconductor memory device according to an embodiment of the invention may be shown in the following Table 3.

TABLE 3

| | | BL | DSL1 | DSL2 | WLn | WL0 to WLn − 1 | SSL | Sel CSL | Unsel CSL |
|---|---|---|---|---|---|---|---|---|---|
| DST1 Program (Pgm) | Method 1 | 4 V→Verify Pass→0 V | Vpgm2 | Vpass | Vpass | Vpass | Vpass | 0 V | 4 V |
| | Method 2 | 4 V→Verify Pass→0 V | Vpgm2 | GIDL or DAHC or DIBL | Vpass | Vpass | Vpass | 0 V | 4 V |
| DST2 Pgm | Method 1 | 4 V→Verify Pass→0 V | Vpass | Vpgm2 | Vpass | Vpass | Vpass | 0 V | 4 V |
| | Method 2 | 4 V→Verify Pass→0 V | Vpass | Vpgm2 | GIDL or DAHC or DIBL | Vpass | Vpass | 0 V | 4 V |

1) Operation of Selecting a Memory Layer in which a Coding Program Operation is Performed (S510)

A memory layer in which a coding program operation is performed so that the first and second drain select transistors DST1 and DST2 among the plurality of memory layers (the first to fourth layers) have a multi-level may be selected. At this time, the first to last memory layers (the first to fourth layers) may be sequentially selected.

2) Coding Program Operation on DST1 (S520)

First, the first drain select transistor DST1 of the selected memory layer (for example, the first layer) may be coding-programmed.

A method of performing the coding program operation on the first drain select transistor DST1 may be performed in two methods.

A first method may be a hot carrier injection (HCI) method. The pass voltage Vpass may be applied to the second drain select line DSL2. In addition, the plurality of word lines WLs: WL0 to WLn, and a high voltage (4V) may be applied to the bit line. Accordingly, a hot carrier may be generated in a channel adjacent to the first drain select transistor DST1. In addition, and at this time, the first drain select transistor DST1 may be programmed by tunneling the hot carrier to a charge storage layer of the first drain select transistor DST1 when a program voltage Vpgm2 having a lower potential level than a normal program voltage is applied to the first drain select line DSL1. When it is determined that the program operation is passed by performing a verifying operation after the program operation, increase of the threshold voltage may be prevented by applying 0V to the bit line.

A second method may be a method using a GIDL, a DAHC, or a DIBL. The pass voltage Vpass may be applied to the second drain select line DSL2, and the plurality of word lines WLs: WL0 to WLn. In addition, a high voltage (4V) may be applied to the bit line. At this time, the second drain select transistor DST2 may be turned on so that the GIDL, the DAHC, or the DIBL is generated in the second drain select transistor DST2, but a voltage applied to the second drain select line DSL2 may be adjusted so that the second drain select transistor DST2 is shallowly turned on. At this time, when the program voltage Vpgm2 having the lower potential level than the normal program voltage is applied to the first drain select line DSL1, a carrier generated by the GIDL, DAHC, or DIBL may be tunneled to the charge storage layer of the first drain select transistor DST1. Further, the first drain select transistor DST1 may be programmed. When it is determined that the program operation is passed by performing a verifying operation after the program operation, increase of the threshold voltage may be prevented by applying 0V to the bit line.

3) Coding Program Operation on DST2 (S530)

After the coding program operation on the first drain select transistor DST1 is completed, the coding program operation on the second drain select transistor DST2 may be performed.

The coding program operation on the second drain select transistor DST2 may be the same as that of the first drain select transistor DST1.

4) Operation of Confirming Whether a Memory Layer is a Last Memory Layer (S540)

It may be confirmed whether the memory layer in which a current coding program operation is performed is the last memory layer (the fourth layer). When it is determined that the memory layer is not the last memory layer (the fourth layer), it may be returned to the operation of selecting the memory layer in which the coding program operation is performed (S510) by selecting a next memory layer of the currently selected memory layer accordingly.

In the method of operating the semiconductor memory device described above, only a selected memory layer among the plurality of memory layers may be selectively activated according to a voltage applied to the first and second drain select lines in the program or read operation of the semiconductor memory device by performing the coding program operation on the drain select transistors arranged in each memory layer.

Figure 6:
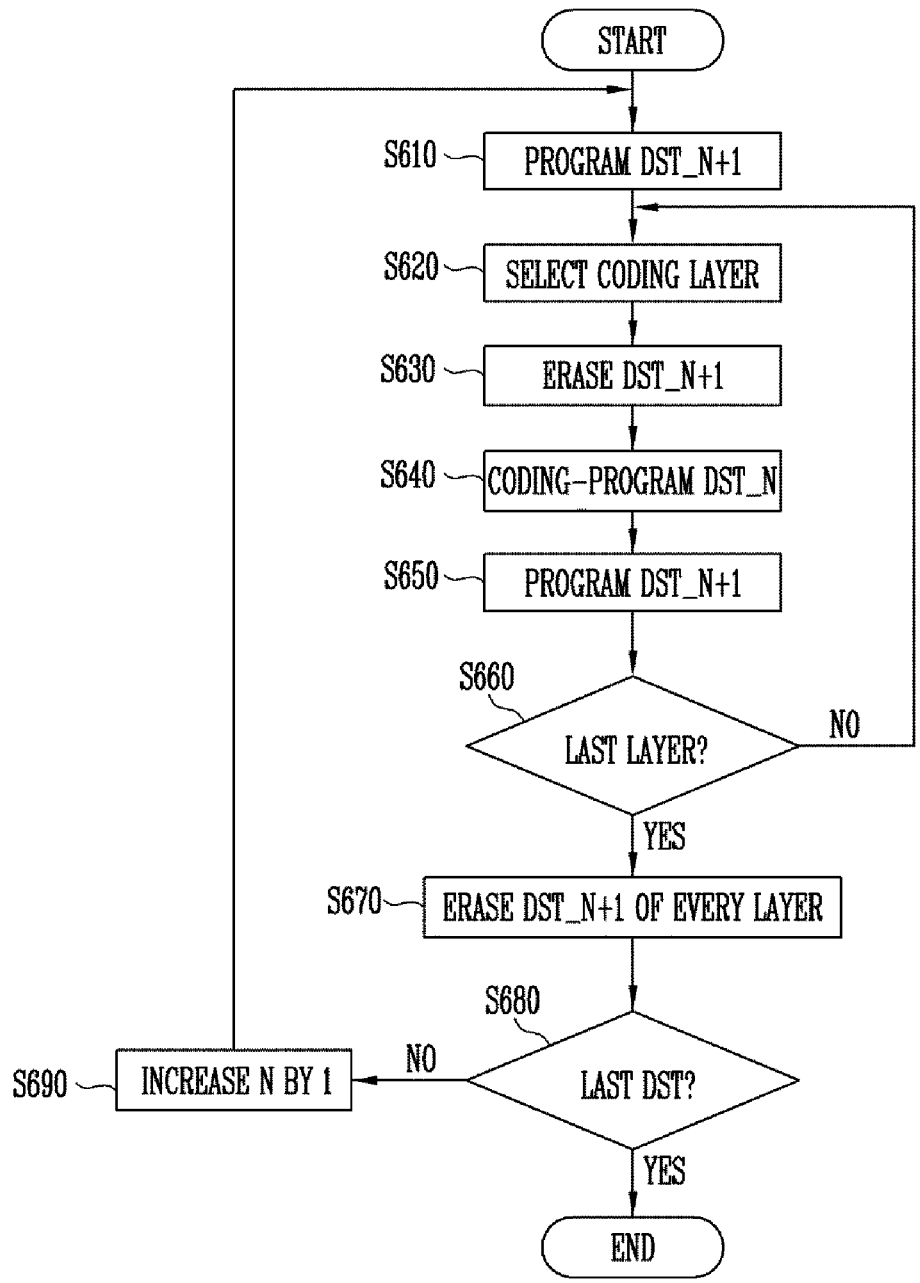
FIG. 6 is a flowchart for describing a method of operating the semiconductor memory device shown in FIG. 4.

Referring to FIG. 6, a flowchart for describing a method of operating the semiconductor memory device shown in FIG. 4 is shown.

In FIGS. 4 and 6, a method of operating the semiconductor memory device according to an embodiment of the invention will be described.

Bias voltages applied in the method of operating the semiconductor memory device according to an embodiment of the invention are shown in the following Table 4.

TABLE 4

|  | BL | DSL1 | DSL2 | WLn | WL0 to WLn − 1 | SSL | Sel CSL | Unsel CSL |
|---|---|---|---|---|---|---|---|---|
| DST1 Program (Pgm) | 4 V→Verify Pass→0 V | Vpgm2 | Vpass2 | Vpass | Vpass | Vpass | 0 V | 4 V |
| DST2 Pgm | 4 V→Verify Pass→0 V | Vpass | Vpgm2 | Vpass2 | Vpass | Vpass | 0 V | 4 V |

TABLE 5

|  | BL | DSL1 | DSL2 | WLn | WL0 to WLn − 1 | SSL | Sel CSL | Unsel CSL |
|---|---|---|---|---|---|---|---|---|
| DST1 Program (Pgm) | 4 V→Verify Pass→0 V | Vpgm2 | GIDL or DAHC or DIBL | Vpass | Vpass | Vpass | 0 V | 4 V |
| DST2 Pgm | 4 V→Verify Pass→0 V | Vpass | Vpgm2 | GIDL or DAHC or DIBL | Vpass | Vpass | 0 V | 4 V |

1) Program Operation on DST_N+1 (S610)

First, an N+1-th drain select transistor of every memory layer (the first to fourth layers) may be programmed. N may be set as 1 in an initial operation. More specifically, the second drain select transistor DST2 may be programmed in the initial operation.

The program operation on the second drain select transistor DST2 may be performed by the HCI method or the method of using the GIDL, the DAHC, or the DIBL described above using the bias voltages shown in Tables 4 and 5.

When an N-th drain select transistor is the last drain select transistor DST2, the N+1-th drain select transistor may be defined as a memory cell MCn.

2) Operation of Selecting a Memory Layer in which a Coding Program Operation is Performed (S620)

A memory layer in which a coding program operation is performed so that the first and second drain select transistors DST1 and DST2 among the plurality of memory layers (the first to fourth layers) have a multi-level may be selected. At this time, the first memory layer (the first layer) to the last memory layer (the fourth layer) may be sequentially selected accordingly.

3) Erase Operation on DST_N+1 (S630)

An erase operation on a drain select transistor DST_N+1 of the selected memory layer may be performed. At this time, the erase operation may be performed in two methods.

A first method may be a method of applying the erase voltage Verase through the common source line CSL1. After controlling the bit lines BL1 to BL3 to be in a floating state F, the N-th drain select transistor DST_N may be turned on by applying a turn-on voltage Vt+1V to an N-th drain select line DSL_N. After this, the pass voltage Vpass may be applied to the plurality of word lines WLs: WL0 to WLn. The erase voltage Verase may be applied to the common source line CSL1 of the memory layer (for example, the first layer) selected as the coding program memory layer. In addition, only the pre-programmed N+1-th drain select transistor DST_N+1 may be selectively erased. At this time, it may be desirable to apply a set voltage Ver-a having a lower potential level than the erase voltage Verase to the source select line SSL.

A second method may be a method of erasing by boosting a channel to a high potential. After controlling the bit lines BL1 to BL3 to be in the floating state F, the drain select transistor DST_N+1 may be turned off by applying a voltage of 0V to the first drain select transistor DST1. The power supply voltage Vdc may be applied to the common source line CSL1 and the source select line SSL of the memory layer (for example, the first layer) selected as the coding program memory layer. After this, the pass voltage Vpass may be applied to the plurality of word lines WLs: WL0 to WLn. In addition, the channel of the cell string may be boosted to the high potential. Accordingly, the N+1-th drain select transistor DST_N+1 adjacent to the boosted channel may be erased by a potential difference with the boosted channel.

4) Coding Program Operation on DST_N (S640)

The coding program operation on the N-th drain select transistor DST_N may be performed. The pass voltage Vpass may be applied to the plurality of word lines WL0 to WLn and the source select line SSL. Further, a voltage of 0V may be applied to a selected common source line CSL1. Moreover, a high voltage (4V) may be applied to a selected bit line. Accordingly, a hot carrier may be generated in a channel adjacent to the N-th drain select transistor DST_N, and at this time, the N-th drain select transistor DST_N may be programmed by tunneling the hot carrier to a charge storage layer of the N-th drain select transistor DST_N when a program voltage Vpgm2 having a lower potential level than a normal program voltage is applied to the N-th drain select transistor DST_N. At this time, a set pass voltage Vpass2 may be set by adjusting the pass voltage Vpass applied to the N+1-th drain select transistor DST_N+1 adjacent in a source direction with the N-th drain select transistor DST_N. It may be desirable to set the set pass voltage Vpass2 as a value between a program threshold voltage and an erase threshold voltage. As a result, the hot carrier may not be generated in the non-selected memory layer since the programmed N+1-th drain select transistor is turned off by the set pass voltage Vpass2. However, the hot carrier may be generated in the selected memory layer since the erased N+1-th drain select transistor DST_N+1 is turned on by the set pass voltage Vpass2. Accordingly, only the N-th drain select transistor DST_N of the selected memory layer may be selectively coding-programmed.

5) Program Operation on DST_N+1 (S650)

When the coding program operation on the N-th drain select transistor DST_N is completed, the N+1-th drain select transistor DST_N+1 which is in the erase state may be programmed. The program operation on the N-th drain select transistor DST_N may be similar to the program operation on the DST_N+1 (S610).

6) Operation of Confirming Whether a Memory Layer is a Last Memory Layer (S660)

It may be confirmed whether a memory layer in which a current coding program operation is performed is a last memory layer (the fourth layer). When it is determined that the memory layer is not the last memory layer, a next memory layer of the currently selected memory layer may be selected. In addition, it may be returned to the operation of selecting the memory layer in which the coding program operation is performed (S620).

7) Erase Operation on DST_N+1 of Every Memory Layer (S670)

In the operation of confirming whether the memory layer described above is the last memory layer (S660), when it is determined that the currently selected memory layer is the last memory layer (the fourth layer), the N+1-th drain select transistor of every memory layer may be erased. Accordingly, a side effect of the cell string may be prevented.

A method of erasing the N+1-th drain select transistor DST_N+1 may be performed by a method of applying the erase voltage Verase through the common source lines CSL1 to CSL4. In the alternative, a method of erasing by boosting the channel to a high potential may be performed.

8) Operation of Confirming Whether a Drain Select Transistor is a Last DST (S680)

It may be confirmed whether the N-th drain select transistor is the last drain select transistor (for example, DST2).

9) Operation of Selecting a Next DST (S690)

In the operation of confirming whether the N-th drain select transistor is the last drain select transistor (S680) described above, when it is determined that the N-th drain select transistor is not the last drain select transistor, it may be returned to the program operation on the DST_N+1 (S610) described above by selecting a next drain select transistor accordingly. At this time, it may be desirable to increase N by 1.

As described above, in the method of operating the semiconductor memory device, only the selected memory layer among the plurality of memory layers may be selectively activated according to a voltage applied to the first and second drain select lines in the program or read operation of the semiconductor memory device by performing the coding program operation on the drain select transistors arranged in each memory layer.

Figure 7:
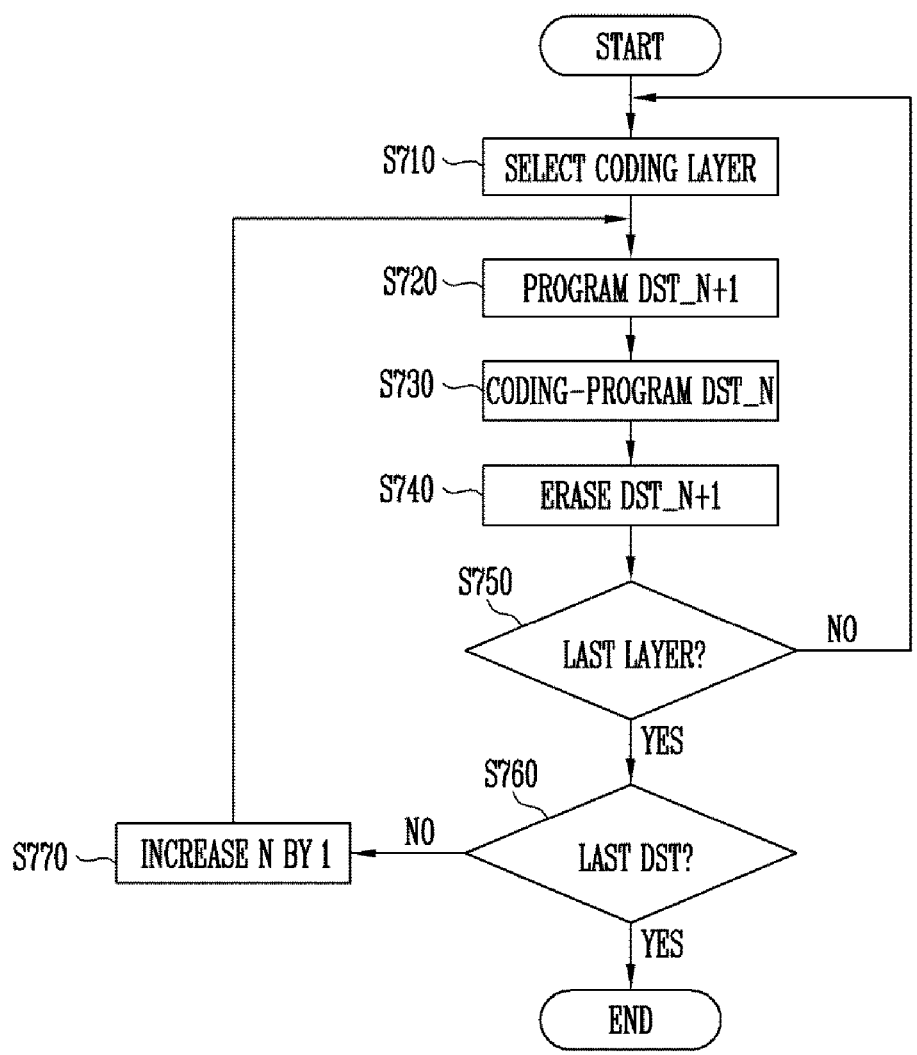
FIG. 7 is a flowchart for describing a method of operating the semiconductor memory device shown in FIG. 4.

Referring to FIG. 7, a flowchart for describing a method of operating the semiconductor memory device shown in FIG. 4 is illustrated.

In FIGS. 4 and 7, a method of operating the semiconductor memory device according to an embodiment of the invention will be described.

Bias voltages applied in the method of operating the semiconductor memory device according to an embodiment of the invention are shown in the following Table 6.

TABLE 6

|  | BL | DSL1 | DSL2 | WLn | WL0 to WLn − 1 | SSL | Sel CSL | Unsel CSL |
|---|---|---|---|---|---|---|---|---|
| DST1 Program (Pgm) | 4 V→Verify Pass→0 V | Vpgm2 | GIDL or DAHC or DIBL | Vpass | Vpass | Vpass | 0 V | 4 V |
| DST2 Pgm | 4 V→Verify Pass→0 V | Vpass | Vpgm2 | GIDL or DAHC or DIBL | Vpass | Vpass | 0 V | 4 V |

1) Operation of Selecting a Memory Layer in which a Coding Program Operation is Performed (S710)

A memory layer in which a coding program operation is performed so that the first and second drain select transistors DST1 and DST2 among the plurality of memory layers (the first to fourth layers) have a multi-level may be selected. At this time, the first memory layer (the first layer) to the last memory layer (the fourth layer) may be sequentially selected accordingly.

2) Program Operation on DST_N+1 (S720)

First, the N+1-th drain select transistor of the selected memory layer may be programmed. In an initial operation, N may be set as 1. More specifically, in the initial operation, the second drain select transistor DST2 may be programmed.

The program operation on the second drain select transistor DST2 may be performed by the method using the GIDL, the DAHC, or the DIBL described above.

When the N-th drain select transistor DST_N is the last drain select transistor, the N+1-th drain select transistor DST_N+1 may be defined as the memory cell MCn.

3) Coding Program Operation on DST_N (S730)

The coding program operation on the N-th drain select transistor DST_N may be performed. The pass voltage Vpass may be applied to the plurality of word lines WL0 to WLn and the source select line SSL. In addition, a voltage of 0V may be applied to a selected common source line CSL1. Further, a high voltage (4V) may be applied to a selected bit line. Accordingly, a hot carrier may be generated in a channel adjacent to the N-th drain select transistor DST_N. In addition, and at this time, when the program voltage Vpgm2 having a lower potential level than a normal program voltage is applied to the N-th drain select transistor DST_N, the N-th drain select transistor DST_N may be programmed by tunneling the hot carrier to a charge storage layer of the N-th drain select transistor. At this time, the pass voltage Vpass2 may be set by adjusting the pass voltage applied to the N+1-th drain select transistor DST_N+1 adjacent in a source direction with the N-th drain select transistor DST_N. It may be desirable to set the pass voltage Vpass2 as a value between the program threshold voltage and the erase threshold voltage. Accordingly, the hot carrier may not be generated in the non-selected memory layer since the programmed N+1-th drain select transistor is turned off by the set pass voltage Vpass2. However, the hot carrier may be generated in the selected memory layer since the erased N+1-th drain select transistor is turned on by the set pass voltage Vpass2. Accordingly, only the N-th drain select transistor of the selected memory layer may be selectively coding-programmed as a result.

4) Erase Operation on DST_N+1 (S740)

The N+1-th drain select transistor DST_N+1 of the selected memory layer may be erased. A method of erasing the N+1-th drain select transistor DST_N+1 may be performed by a method of applying the erase voltage Verase through the common source lines CSL1 to CSL4 or a method of erasing by boosting the channel to a high potential.

5) Operation of Confirming Whether a Memory Layer is a Last Memory Layer (S750)

It may be confirmed whether a memory layer in which a current coding program operation is performed is a last memory layer. When it is determined that the memory layer is not the last memory layer (the fourth layer), it may be returned to the operation of selecting the memory layer in which the coding program operation is performed (S710) by selecting a next memory layer of the currently selected memory layer.

6) Operation of Confirming Whether a Drain Select Transistor is a Last DST (S760)

It may be confirmed whether the N-th drain select transistor is the last drain select transistor (for example, DST2).

7) Operation of Selecting a Next DST (S770)

In the operation of confirming whether the drain select transistor is the last DST (S760) described above, when it is determined that the drain select transistor is not the last DST, it may be returned to the program operation on the DST_N+1 (S720) by selecting the next drain select transistor. At this time, it may be desirable to increase N by 1.

As described above, in the method of operating the semiconductor memory device, only the selected memory layer among the plurality of memory layers may be selectively activated according to a voltage applied to the first and second drain select lines in the program or read operation of the semiconductor memory device by performing the coding program operation on the drain select transistors arranged in each memory layer.

Figure 8:
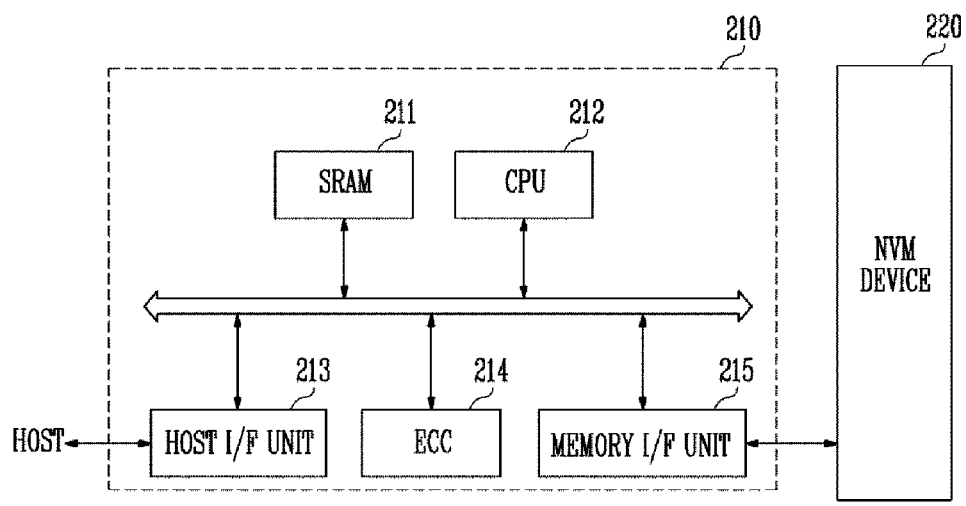
FIG. 8 is a block diagram illustrating a memory system including the semiconductor memory device of FIG. 1.

Referring to FIG. 8, a block diagram illustrating a memory system including the semiconductor memory device of FIG. 1.

In FIG. 8, a memory system 200 according to an embodiment of the invention may include a non-volatile memory (NVM) device 220 and a memory controller 210.

The non-volatile memory device 220 may have the same configuration and operation as the semiconductor memory device 10 or 100 described with reference to FIG. 1 or 4. The memory controller 210 may be configured to control the non-volatile memory device 220. The memory system 200 may be provided as a memory card or a solid state disk (SSD) formed by combining the non-volatile memory device 220 and the memory controller 210. A static random access memory (SRAM) 211 may be used as an operation memory of a processing unit (CPU) 212. A host interface (I/F) unit 213 may include a data exchange protocol of a host electrically coupled to the memory system 200. An error correction circuit (ECC) 214 may detect and correct an error included in data read from the non-volatile memory device 220. A memory interface (I/F) unit 215 may perform interfacing with the non-volatile memory device 220 of the invention. The processing unit 212 may perform various control operations for data exchange of the memory controller 210.

It is apparent to those of ordinary skill in the art that the memory system 200 according to an embodiment of the invention may further include a read only memory (ROM) (not shown) for storing code data to interface with the host. The non-volatile memory device 220 may be provided as a multi-chip package configured by a plurality of flash memory chips. The memory system 200 according to an embodiment of the invention may be provided as a high reliability storage media having a lower error generating probability. More specifically, the flash memory device of the invention may be included in the memory system 200 such as the SSD which is recently and actively being studied. In this case, the memory controller 210 may communicate with the outside (for example, the host) through one among various interface protocols such as a Universal Serial Bus (USB) protocol, a MultiMediaCard (MMC) protocol, a Peripheral Component Interconnect-Express (PCI-E) protocol, a Serial-Advanced Technology Attachment (SATA) protocol, a Parallel-ATA (PATA) protocol, a Small Computer System Interface (SCSI) protocol, an Enhanced Small Disk Interface (ESDI) protocol, an Integrated Drive Electronics (IDE) protocol, etc.

Figure 9:
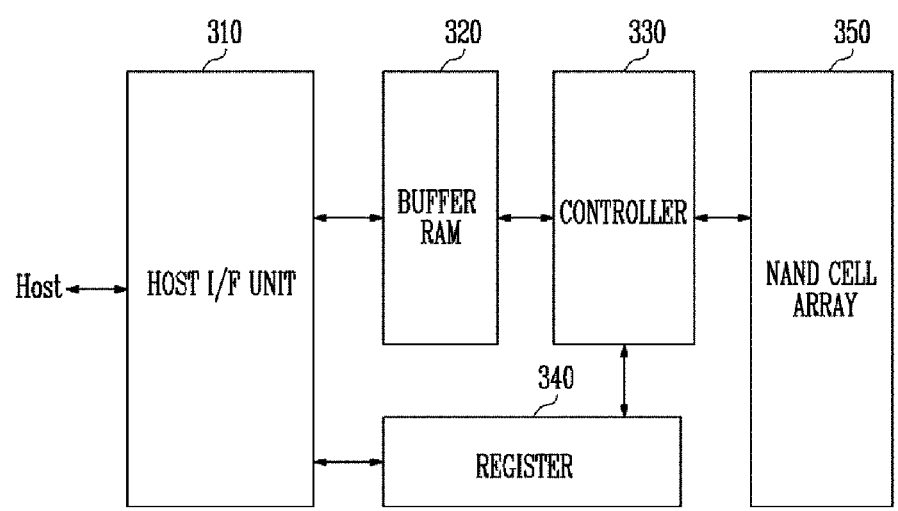
FIG. 9 is a block diagram illustrating an application example of the memory system of FIG. 8.

Referring to FIG. 9, a block diagram illustrating an application example of the memory system of FIG. 8 is shown. For example, technical features of the invention may be applied to OneNAND flash memory device 300 as a fusion memory device.

The OneNAND flash memory device 300 may include a host interface unit 310 to exchange various kinds of information with a device using a different protocol; a buffer RAM 320 for embedding codes for driving the memory device or for temporarily storing data; a controller 330 for controlling a read operation; a program operation; and every state in response to a control signal and a command input from the outside; a register 340 for storing data such as an instruction; an address; and a configuration defining a system operating environment inside the memory device; and a NAND flash cell array 350 configured as an operation circuit including a non-volatile memory cell and a page buffer.

Figure 10:
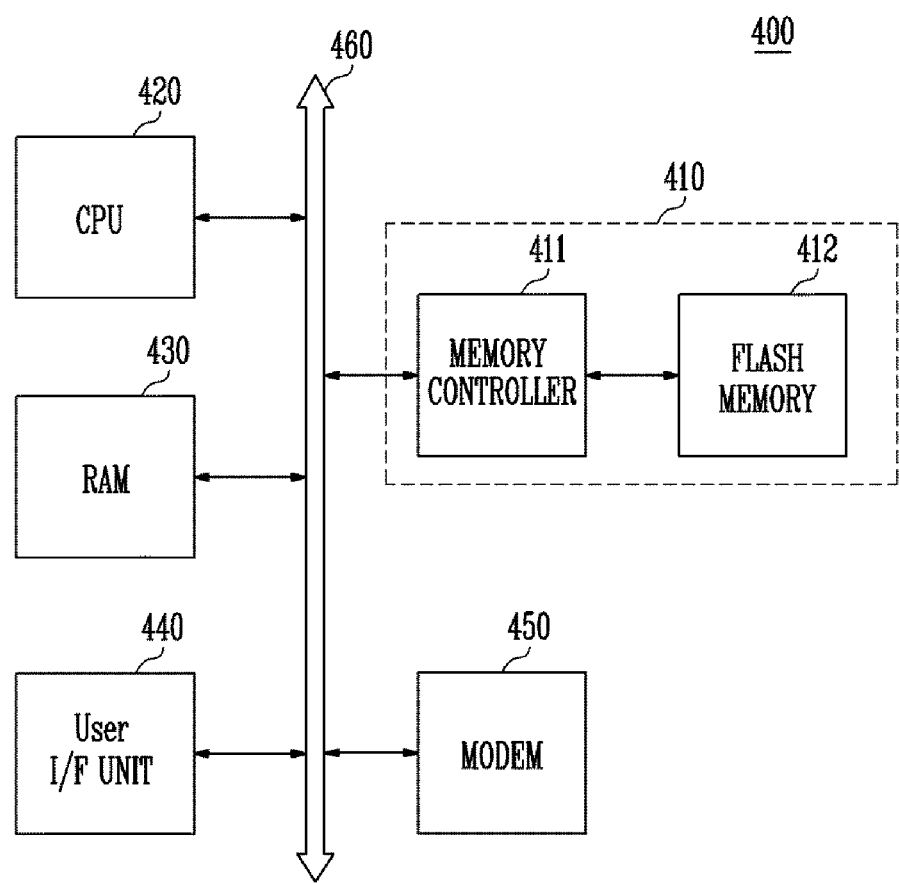
FIG. 10 is a block diagram illustrating a computing system including a memory system described with reference to FIG. 9.

Referring to FIG. 10, a block diagram illustrating a computing system including a memory system described with reference to FIG. 9 is described.

The computing system 400 according to an embodiment of the invention may include a microprocessor (CPU) 420, a RAM 430, a user interface (I/F) unit 440, a modem 450 such as a baseband chipset, and a memory system 410, which are electrically coupled to a system bus 460. When the computing system 400 according to the invention is a mobile device, the computing system 400 may further include a battery to supply an operating voltage of the computing system 400. Although not shown, it is apparent to those of ordinary skill in the art that the computing system 400 according to the invention may further include an application chip set, a camera image processor (CIS), a mobile DRAM device, etc. For example, the memory system 410 may be the SSD using the non-volatile memory to store data. The memory system 410 may be provided as a fusion flash memory (for example, the OneNAND flash memory). FIG. 10 also illustrates a memory controller 411 and a flash memory 412.

According to an embodiment of the invention, in the three-dimensional semiconductor memory device having the structure in which the plurality of memory layers are stacked on the semiconductor substrate, coding threshold voltage distribution of the drain select transistor arranged in each memory layer may be improved by additionally arranging the connection control transistor to control the connection of each memory layer and the common bit line between the common bit line and the drain select transistor of each memory layer. Accordingly, efficiency of the memory cells can be improved since the multi-level coding on the drain select transistor can be performed.

An embodiment of the invention may not be implemented by only the device and the method described above, and it may be implemented by a program performing a function corresponding to the configuration of an embodiment of the invention or a recording medium in which the program is recorded. This embodiment may be easily implemented by those of ordinary skill in the art from the description.

The technical spirit of the invention described above has been described with reference to various embodiments in detail, but it should be noted that the embodiments are used for the description and are not for purposes of limitation. Therefore, it will be understood by those of ordinary skill in the art that various changes in form and details may be made therein without departing from the spirit and scope of the invention as defined by the following claims.

What is claimed is:

1. A semiconductor memory device, comprising a plurality of memory layers stacked on a semiconductor substrate,
   wherein each of the plurality of memory layers comprises a plurality of cell strings electrically coupled between a plurality of bit lines and a common source line and each of the plurality of cell strings comprises two or more connection control transistors, one or more drain select transistors, a plurality of memory cells, and a source select transistor electrically coupled in sequence between each of the plurality of bit lines and the common source line, and
   the plurality of memory layers share the plurality of bit lines, and the common source lines electrically coupled to each of the plurality of memory layers are electrically disconnected,
   wherein the connection control transistors are different from the drain select transistors,
   wherein the connection control transistor is erased by an erase voltage applied through the common source line or erased by boosting a channel to a designated potential, and
   wherein the two or more connection control transistors are programmed before a program operation on the one or more drain select transistors of a selected memory layer among the plurality of memory layers is performed.

2. The semiconductor memory device of claim 1, wherein a non-selected memory layer and the plurality of bit lines are electrically disconnected in the program operation of the selected memory layer.

3. The semiconductor memory device of claim 2, wherein, in the program operation, the connection control transistors are turned on by a program-allowing voltage applied to a selected bit line among the plurality of bit lines, and are turned off by a program-inhibiting voltage applied to a non-selected bit line.

4. A method of operating a semiconductor memory device comprising a plurality of memory layers stacked on a semiconductor substrate, wherein each of the plurality of memory layers comprises a plurality of cell strings electrically coupled between a plurality of bit lines and a common source line and each of the plurality of cell strings comprises first and second connection control transistors, a drain select transistor, a plurality of memory cells, and a source select transistor electrically coupled in sequence between each of the plurality of bit lines and the common source line, the method comprising:
programming the first and second connection control transistors of the plurality of memory layers;
erasing the second connection control transistor adjacent to the drain select transistor of a selected memory layer;
coding-programming the drain select transistor of the selected memory layer;
programming the second connection control transistor of the selected memory layer; and
erasing the first and second connection control transistors, wherein the connection control transistors are different from the drain select transistors.

5. The method of operating the semiconductor memory device of claim 4, after the programming of the second connection control transistor, performing again from the erasing of the second connection control transistor of the selected memory layer by selecting a next memory layer when the selected memory layer is not a last memory layer among the plurality of memory layers.

6. The method of operating the semiconductor memory device of claim 4, wherein the erasing of the second connection control transistor of the selected memory layer selectively erases only the programmed second connection control transistor by applying an erase voltage to the common source line to which the selected memory layer is electrically coupled.

7. The method of operating the semiconductor memory device of claim 4, wherein the erasing of the second connection control transistor of the selected memory layer selectively erases only the programmed second connection control transistor by applying a pass voltage to the drain select transistor and the plurality of memory cells and boosting a channel of the selected memory layer after applying a power supply voltage to the common source line of the selected memory layer.

8. The method of operating the semiconductor memory device of claim 4, wherein the coding-programming of the drain select transistor of the selected memory layer turns on the second connection control transistor electrically coupled to a selected bit line among the second connection control transistors of the selected memory layer, and turns off the second connection control transistor electrically coupled to a non-selected bit line by applying a program-allowing voltage to the selected bit line among the plurality of bit lines and applying a program-inhibiting voltage to the non-selected bit line.

9. The method of operating the semiconductor memory device of claim 4, wherein the common source lines electrically coupled to each of the plurality memory layers are electrically disconnected.

10. A method of operating a semiconductor memory device comprising a plurality of memory layers stacked on a semiconductor substrate, wherein each of the plurality of memory layers comprises a plurality of cell strings electrically coupled between a plurality of bit lines and a common source line and each of the plurality of cell strings comprises first and second connection control transistors, a drain select transistor, a plurality of memory cells, and a source select transistor electrically coupled in sequence between each of the plurality of bit lines and the common source line, the method comprising:
programming the second connection control transistor adjacent to the drain select transistor of the plurality of memory layers;
erasing the second connection control transistor of a selected memory layer;
coding-programming the drain select transistor of the selected memory layer;
programming the second connection control transistor of the selected memory layer; and
erasing the first and second connection control transistors of the plurality of memory layers,
wherein the connection control transistors are different from the drain select transistors.

11. The method of operating the semiconductor memory device of claim 10, after the programming of the second connection control transistor, performing again from the erasing of the second connection control transistor of the selected memory layer by selecting a next memory layer when the selected memory layer is not a last memory layer among the plurality of memory layers.

12. The method of operating the semiconductor memory device of claim 10, wherein the erasing of the second connection control transistor of the selected memory layer selectively erases only the programmed second connection control transistor by applying an erase voltage to the common source line to which the selected memory layer is electrically coupled.

13. The method of operating the semiconductor memory device of claim 10, wherein the erasing of the second connection control transistor of the selected memory layer selectively erases only the second connection control transistor programmed by applying a pass voltage to the drain select transistor and the plurality of memory cells and boosting a channel of the selected memory layer after applying a power supply voltage to the common source line of the selected memory layer.

14. The method of operating the semiconductor memory device of claim 10, wherein the coding-programming of the drain select transistor of the selected memory layer turns on the second connection control transistor electrically coupled to a selected bit line among the second connection control transistors of the selected memory layer, and turns off the second connection control transistor electrically coupled to a non-selected bit line by applying a program-allowing voltage to the selected bit line among the plurality of bit lines and applying a program-inhibiting voltage to the non-selected bit line.

* * * * *